(12) United States Patent
Agarwal et al.

(10) Patent No.: US 8,089,296 B2
(45) Date of Patent: Jan. 3, 2012

(54) ON-CHIP MEASUREMENT OF SIGNALS

(75) Inventors: Kanak Behari Agarwal, Austin, TX (US); Jerry D. Hayes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 352 days.

(21) Appl. No.: 12/489,525

(22) Filed: Jun. 23, 2009

(65) Prior Publication Data

US 2010/0321050 A1    Dec. 23, 2010

(51) Int. Cl.
*G01R 31/02* (2006.01)
(52) U.S. Cl. .............................. 324/762.01; 324/762.03
(58) Field of Classification Search . 324/762.01–762.03
See application file for complete search history.

(56) References Cited

U.S. PATENT DOCUMENTS

| | | | | |
|---|---|---|---|---|
| 5,625,288 A * | 4/1997 | Snyder et al. | ............ | 324/750.06 |
| 7,098,682 B2 * | 8/2006 | Sasaki | ............ | 324/750.3 |
| 7,724,013 B2 * | 5/2010 | Kim | ............ | 324/750.3 |
| 2003/0030461 A1 * | 2/2003 | Oberle et al. | ............ | 324/765 |
| 2007/0080701 A1 * | 4/2007 | Kim et al. | ............ | 324/765 |

* cited by examiner

*Primary Examiner* — Huy Q Phan
*Assistant Examiner* — Joshua Benitez
(74) *Attorney, Agent, or Firm* — Garg Law Firm, PLLC; Rakesh Garg; Libby Z. Toub

(57) ABSTRACT

A method, system, and computer usable program product for in an integrated circuit are provided in the illustrative embodiments. A signal to be measured is identified in the IC. The signal is provided as a first control voltage input to a first VCO in the IC. A first output frequency is generated from the first VCO, the first output frequency having a first frequency value corresponding to the signal. The signal is provided as a second control voltage input to a second VCO in the IC. A second output frequency is generated from the second VCO, the second output frequency having a second frequency value corresponding to the signal. The first and the second output frequency values are exported from the IC. A mean value and a standard deviation of the signal are computed using the output first and second frequency values.

20 Claims, 6 Drawing Sheets

ON-CHIP MEASUREMENT OF SIGNALS

BACKGROUND OF THE INVENTION

1. Field of the Invention

The present invention relates generally to an improved signal measurement system, and in particular, to a method for measuring signals in an integrated circuit. Still more particularly, the present invention relates to a method, system, and computer usable program code for on-chip measurement of signals in an integrated circuit.

2. Description of the Related Art

Modern day electronics include components that use integrated circuits (ICs). Integrated circuits are electronic circuits formed using Silicon as a substrate and by adding impurities to form solid-state electronic devices, such as transistors, diodes, and resistors. Commonly known as a "chip", an integrated circuit is generally encased in hard plastic. The components in modern day electronics generally appear to be rectangular black plastic pellets with connector pins protruding from the plastic encasement.

Circuit designers use a variety of software tools to design and test electronic circuits that accomplish an intended task. For example, a digital circuit may be designed to accept digital inputs, perform some computation, and produce a digital output. An analog circuit may be designed to accept analog signals, manipulate the analog signals, such as my amplifying, filtering, or mixing the signals, and produce an analog or digital output. Generally, any type of circuit can be designed as an IC.

Some of these software tools, other hardware and software applications are also used in combination to test various characteristics of the electronic circuits. For example, a voltage measuring apparatus may be used to measure voltage at various nodes in the IC.

SUMMARY OF THE INVENTION

The illustrative embodiments provide a method, system, and computer usable program product for on-chip measurement of signals in an IC. According to the invention, a process identifies a signal to be measured in the IC. The process provides the signal as a first control voltage input to a first VCO in the IC. The process generates a first output frequency from the first VCO, the first output frequency having a first frequency value corresponding to the signal. The process provides the signal as a second control voltage input to a second VCO in the IC. The process generates a second output frequency from the second VCO, the second output frequency having a second frequency value corresponding to the signal. The process exports the first and the second output frequency values from the IC.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
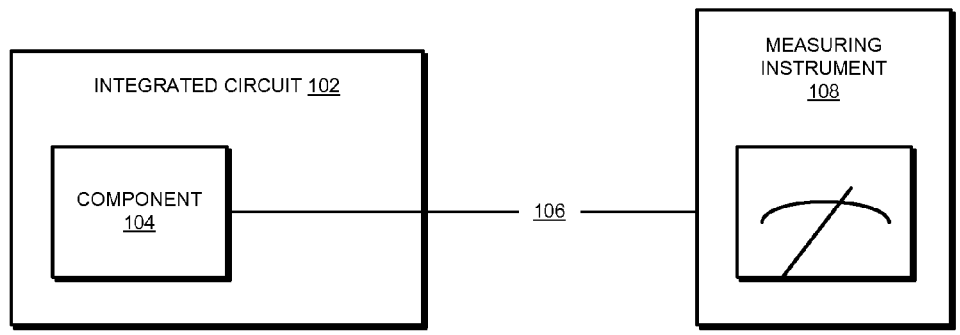
FIG. 1 depicts a block diagram of a signal measurement configuration in which the illustrative embodiments may be implemented.

A signal associated with a component may have to be measured to determine certain characteristics of that or another component in the IC. For example, a voltage signal at a node of a component may have to be measured. As another example, a voltage or a signal at a node may have to be analyzed to determine the signal's characteristics. Generally, for performing the measurements, such as in these example situations, the signal is observed for a certain time period.

An average value of the signal is computed for the signal over that time period. The average value of the signal may be the direct current (DC) equivalent value of the signal. A root mean square (RMS) value of the signal may also be computed for an AC signal over that time period. The average and RMS value of the signal over the time period can then be used to compute the mean value of the signal and the standard deviation of the signal from a threshold value.

Presently, for computing the mean and standard deviation of a signal, the signal is tapped and directed to a measuring instrument. For example, an electrical connection may be made from the node at the component where the signal occurs, to a measuring instrument, such as a multimeter, oscilloscope, or another measuring instrument.

Frequently, other components may be introduced in the present electrical connection from the node to the measuring instrument. For example, a sample-and-hold circuit, also known as a buffer circuit, may be used in the electrical connection if the signal varies faster than the instrument can measure. As another example, an input/output (I/O) driver may be introduced in the present electrical connection to drive the signal off-chip, such as for measurement or manipulation off-chip.

The invention recognizes that presently used methods for measuring the average, RMS, mean, and standard deviation of a signal may not be fast enough, accurate enough, or both, for certain applications. For example, the invention recognizes that driving a signal off-chip may introduce noise in the signal, latency in the measurement, or both. The invention recognizes that such latency and noise may not be acceptable in some circumstances.

An I/O driver or other similar component in the electrical circuit from the on-chip node to the off-chip measuring instrument may also cause the output signal to be different from the input signal. For example, the voltage of the output signal to an external instrument may not be exactly the same as the voltage of the input signal from the node of the component where the signal is being measured due to the noise introduced in the signal as the signal is driven off-chip. Such alterations of the signal may not be acceptable in some circumstances.

The invention recognizes that measuring a signal in the present manner may be slow, inaccurate, or both for certain applications. For example, certain tests of the IC design may execute faster than measurements can be generated from the present techniques. As another example, certain design considerations may be sensitive to variations in the signal that may be smaller than the inaccuracies introduced by the present techniques of measuring the signal off-chip.

The illustrative embodiments used to describe the invention address and solve these and other problems related to measuring signals and mean and standard deviation values thereof, in an IC. The illustrative embodiments provide a method, computer usable program product, and an apparatus for on-chip measurement of signals in an IC. An on-chip measurement according to the invention is a measurement performed within the IC, such that the output from the IC is not the signal itself but a value resulting from the measurement, or a converted form of the signal such that the waveform and characteristics of the signal are preserved. In one embodiment, the output from the chip is a digital value that can be scanned from the chip.

Using the illustrative embodiments, a signal can be converted within the IC to two or more frequency values that are usable in performing the mean and standard deviation computations outside the IC. The frequency values generated according to the invention generally provide a more accurate representation of the signal as compared to the present techniques. The measurements can be made on-chip, and the resulting values can be digitally scanned out from the chip.

The examples in this disclosure are used only for the clarity of the description and are not limiting on the illustrative embodiments. Additional operations, actions, tasks, activities, and manipulations will be conceivable from this disclosure and the same are contemplated within the scope of the illustrative embodiments.

The illustrative embodiments are described using specific code, data structures, designs, layouts, schematics, and tools only as examples and are not limiting on the illustrative embodiments. The illustrative embodiments may be implemented with respect to other similarly purposed code, data structures, designs, layouts, schematics, and tools within the scope of the invention.

Furthermore, the illustrative embodiments may be described in some instances using particular systems, applications, or architectures only as an example for the clarity of the description. The illustrative embodiments may be used in conjunction with other comparable or similarly purposed systems, applications, or architectures.

Any advantages listed herein are only examples and are not intended to be limiting on the illustrative embodiments. Additional or different advantages may be realized by specific illustrative embodiments. Furthermore, a particular illustrative embodiment may have some, all, or none of the advantages listed above.

With reference to FIG. 1, this figure depicts a block diagram of a signal measurement configuration in which the illustrative embodiments may be implemented. IC 102 may be any IC. Component 104 may be a component within IC 102. Component 104 may be an analog component, a digital component, or a combination thereof.

Connection 106 may be an electrical connection between a point or a node in component 104 and measuring instrument 108. A signal from component 104 may be electrically communicated to measuring instrument 108 over connection 106.

An oscilloscope may be an example of measuring instrument 108, as presently used for measuring signals from a component in an IC. Measuring instrument 108 may perform a mean value computation, such as by computing an average value of the signal. Measuring instrument 108 may also compute a RMS value of the measured signal from a threshold over a period of time. The standard deviation of the measured signal can then be computed from average and RMS value using known mathematical principles.

Figure 2:
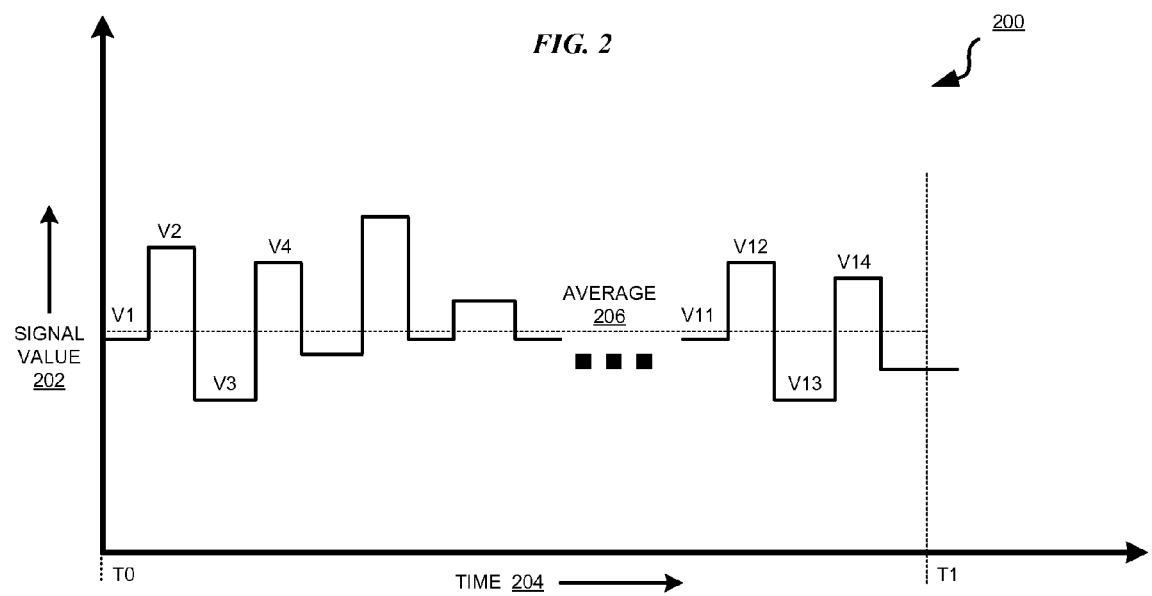
FIG. 2 depicts a graph of a signal that can be measured in accordance with an illustrative embodiment.

With reference to FIG. 2, this figure depicts a graph of a signal that can be measured in accordance with an illustrative embodiment. Graph 200 may be a graph representing the signal communicated over connection 106 in FIG. 1.

Graph 200 plots signal value 202 (Y-axis) over time 204 (X-axis). Assuming an example signal to be a voltage signal, graph 200 shows an example fluctuation in the voltage over time 204. The voltage signal may have varying values depicted as V1, V2, V3, V4, and any number of other values over a predetermined time. Signal values V1, V2, V3, V4 and other values may, over another period of time, repeat in the same or different order, repeat partially or not at all, or be replaced with other values, for example, V11, V12, V13, and V14, in other measurement time periods. Average 206 represents an average value of the voltage signal between time T0 and T1.

Various embodiments of the invention may be applicable for measuring or characterizing the mean and the standard deviation of a process parameter variation in a circuit design. In such circumstances, the focus of the various embodiments may not be to measure a signal at a node in a circuit, but to observe a signal being modulated by certain process parameter variations, and measure the statistics of the process parameter by on-chip analysis of the signal.

As an example, a waveform similar to the waveform shown in graph 200 may be generated by translating a particular process parameter to voltage values. A process parameter is a design characteristic corresponding to a signal at a node in an IC.

As an example circumstance where the embodiment may be applicable, a circuit design may require measurement of statistics of an interconnect resistance variation. Several copies of resistances may be available in the given design. An on-chip selection logic, or another tool or an application may select one resistance at a time, convert it into a voltage level, and switch to another resistance. The selection logic, tool, or application may repeat this process and get a waveform where the varying voltage levels represent the variation in the resistance.

In this example, an embodiment of the invention may facilitate an analysis of the statistics of this waveform, thereby revealing the variation in the resistance value. The embodiment may further provide the statistical mean and standard deviation of the resistance variation. This process according to an embodiment is more efficient as compared to taking individual measurement on each resistance and computing statistics from hundreds of measurement samples.

A voltage-controlled oscillator (VCO) is an electronic oscillator circuit designed to be controlled in oscillation frequency by a voltage input. The oscillation frequency is the output frequency of the VCO. The output frequency of oscillation of the VCO varies as the applied DC control voltage input varies. When modulating signals are provided as control input to the VCO, the VCO outputs a frequency modulated by the characteristics of the control voltage waveform.

Furthermore, according to an embodiment of the invention, a VCO can be modified in a manner such that a single VCO can operate as two VCOs under different conditions. In effect, the single VCO can be configured to output different frequency characteristics for the same control voltage. According to the embodiment, a VCO is modified to accept a second input called a mode voltage. A mode voltage is a voltage applied to a specific point in the VCO circuit.

The mode voltage is adjustable according to the embodiment, and can be set to different values to manipulate the frequency output of the modified VCO. For example, at one level of mode voltage applied to the modified VCO of the embodiment, a certain input voltage applied to the VCO causes the VCO to output a certain frequency. At another level of mode voltage applied to the same modified VCO, the same input voltage causes the VCO to output a different frequency.

Generally, the frequency output of a VCO may be determined using the following equation—

$$F_1 = a_2 V_g^2 + a_1 V_g + a_0$$

Where for specific values of $a_0$, $a_1$, and $a_2$, the control voltage $V_g$ corresponds to a specific frequency output $F_1$. A certain mode voltage may determine one or more of the constants $a_0$, $a_1$, and $a_2$. Accordingly, if a different mode voltage is applied according to the embodiment, $a_0$ may change to $b_0$, $a_1$ may change to $b_1$, and $a_2$ may change to $b_2$, and a different frequency output $F_2$ may result for the same control voltage $V_g$ according to the following equation—

$$F_2 = b_2 V_g^2 + b_1 V_g + b_0$$

Figure 3:
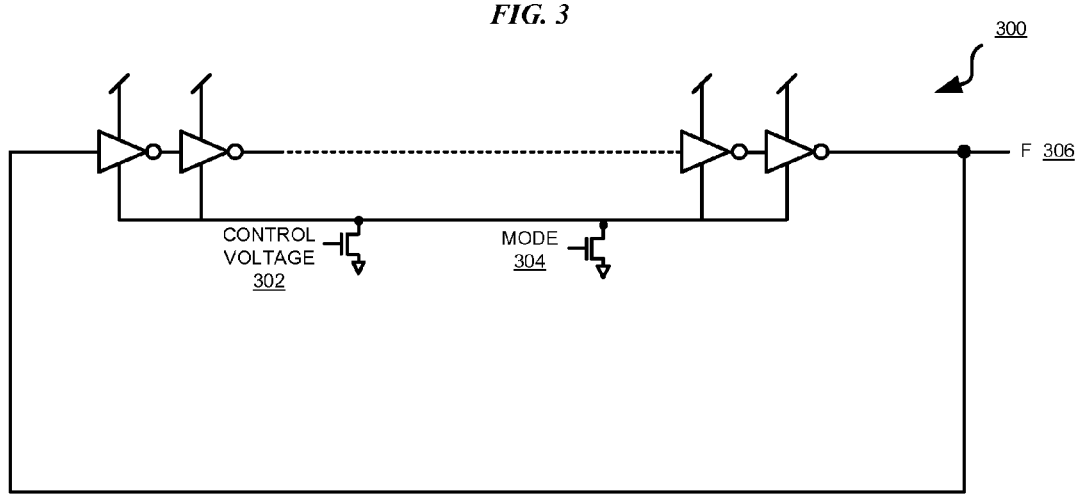
FIG. 3 depicts a circuit diagram of modified VCO in accordance with an illustrative embodiment.

With reference to FIG. 3, this figure depicts a circuit diagram of modified VCO in accordance with an illustrative embodiment. VCO 300 may be a modified VCO as described above. VCO 300 can be implemented in an IC just as any other component or group of components in the IC. For example, in one embodiment, VCO 300 can be implemented as a part of a main circuit of an IC. In another embodiment, VCO 300 may be fabricated as a separate circuit on the chip, for example, as an on-chip tool.

Control voltage 302 may be the input signal that is to be converted into a frequency for performing the measurements according to an illustrative embodiment.

Mode voltage 304 may be a mode voltage that may be applied to VCO 300. VCO 300 outputs frequency 306 as a result of the application of control voltage 302 and optionally mode voltage 304. Applying different mode voltages 304 to VCO 300 causes VCO 300 to output different frequencies 306 for the same control voltage 302. Mode voltage 304 may be optional in one embodiment. For example, when mode voltage 304 is set to zero volts, VCO 300 may operate in a manner similar to the well known VCOs that accept only control voltage 302.

The circuit diagram of VCO 300 in this figure is only depicted as an example circuit that is usable in accordance with one or more of the illustrative embodiments of the invention. VCO 300 is not intended to be limiting on the invention. Any existing VCO design can be modified within the scope of the illustrative embodiments to accept a mode voltage as described with respect to example VCO 300 above.

Furthermore, any design for a VCO, with or without a mode voltage provision, is usable in an embodiment for on-chip measurement of a signal, or for measuring the statistics of a process parameter by on-chip analysis of the signal, within the scope of the invention. For example, absent a mode voltage provision in a chosen VCO design, two different VCOs having different design parameters may be used to generate two different frequencies in the manner of an illustrative embodiment.

Figure 4:
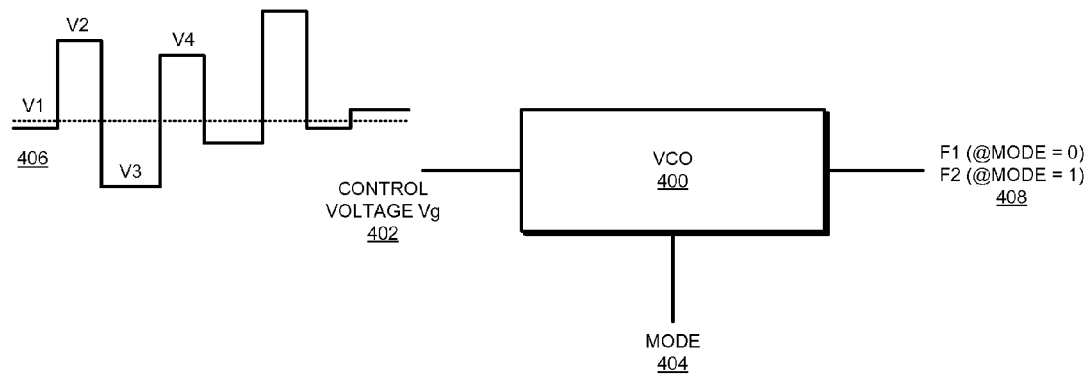
FIG. 4 depicts a block diagram of an example configuration of a VCO in accordance with an illustrative embodiment.

With reference to FIG. 4, this figure depicts a block diagram of an example configuration of a VCO in accordance with an illustrative embodiment. VCO 400 may be implemented using any VCO design, including one or more existing VCO designs modified to accept a mode voltage, VCO 300 in FIG. 3, or a combination thereof.

Control voltage 402 may be analogous to control voltage 302 in FIG. 3. Mode voltage 404 may be analogous to mode voltage 304 in FIG. 3. Waveform 406 may represent a signal that is applied as control voltage 402. Waveform 406 may be similar to graph 200 in FIG. 2, and may represent a signal that is to be measured at a node in a component in an IC.

VCO 400 outputs frequency 408 by processing control voltage 402 and mode voltage 404. Frequency 408 is depicted as F1 when, for example, mode voltage is absent (mode=0). Frequency 408 is depicted as F2, as distinct from frequency F1, when, for example, a certain mode voltage is applied (mode=1).

Figure 5:
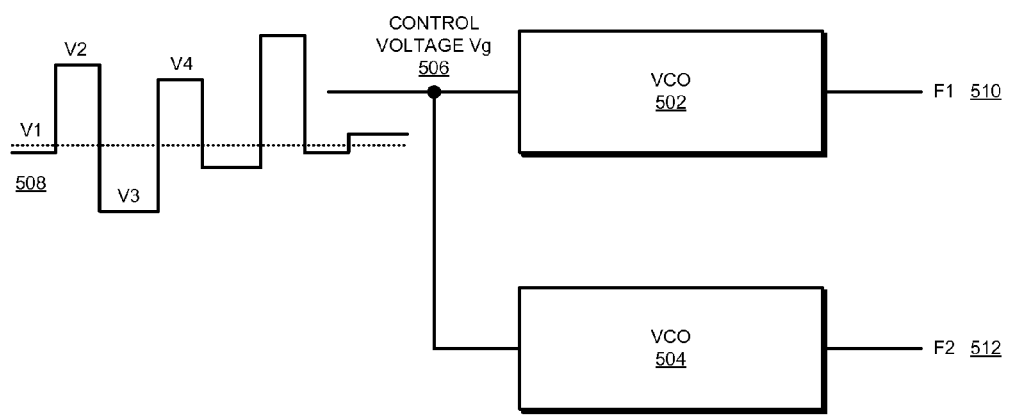
FIG. 5 depicts a block diagram of another example configuration of VCOs in accordance with an illustrative embodiment.

With reference to FIG. 5, this figure depicts a block diagram of another example configuration of VCOs in accordance with an illustrative embodiment. VCO 502 and 504 may each be implemented using any VCO design, including one or more existing VCO designs, one or more existing VCO designs modified to accept a mode voltage according to an embodiment, VCO 300 in FIG. 3, or a combination thereof. Furthermore, VCO 502 and 504 may be implemented with differing design parameters in a common design, or using different designs.

Additionally, a mode voltage is not applied to either VCO 502 or VCO 504 in this depiction only as an example. Mode voltages may be applied to VCO 502, VCO 504, or both, in an implementation of the illustrative embodiment within the scope of the invention.

Control voltage 506 may be analogous to control voltage 302 in FIG. 3. Waveform 508 may represent a signal that is applied as control voltage 506. Waveform 508 may be similar to waveform 406 in FIG. 4, and may represent a signal that is to be measured at a node in a component in an IC.

VCO 502 outputs frequency 510 by processing control voltage 506 and any optional mode voltage. Frequency 510 is depicted as F1. VCO 504 outputs frequency 512 by processing control voltage 506 and any optional mode voltage. Frequency 512 is depicted as F2 and is distinct from frequency F1 510.

Figure 6:
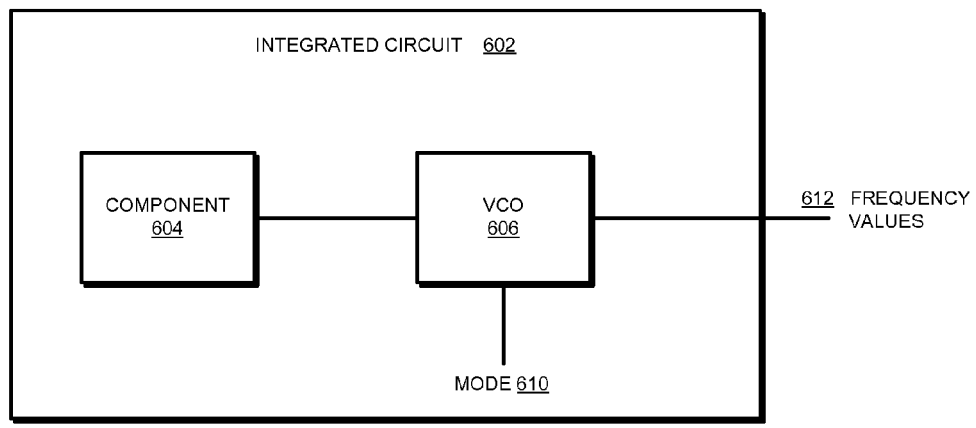
FIG. 6 depicts a block diagram of a configuration of a component and one or more VCOs in an IC to measure a signal in a component in accordance with an illustrative embodiment.

With reference to FIG. 6, this figure depicts a block diagram of a configuration of a component and one or more VCOs in an IC to measure a signal in a component in accordance with an illustrative embodiment. IC 602 may be implemented using IC 102 in FIG. 1. In accordance with an embodiment of the invention, the configuration of FIG. 4, FIG. 5, or a combination thereof can be implemented on IC 602, which includes component 604. Signal 608 may be a signal at a node in component 604 is to be measured using the illustrative embodiment.

Signal 608 is communicated from component 604 to one or more VCOs 606 that are configured according to FIG. 4, FIG. 5, or a combination thereof. Mode voltage 610 may be applied as described to one or more VCOs in VCOs 606. VCOs 606 output frequencies 612 that correspond to one or more portions of the signal waveform.

The signal may be applied to a single VCO at different times with different mode voltages to obtain different frequency values. The signal may be applied to separate VCOs with different configurations at the same time to obtain different frequency values. The signal may be applied to separate VCOs with different configurations, with or without mode voltages, or with same or different mode voltages, at the same time to obtain different frequency values. The signal may be applied to separate VCOs of same or different configurations with or without mode voltages, or with same or different mode voltages, at different times to obtain different frequency values.

Thus, a voltage to frequency conversion can be accomplished on-chip according to the illustrative embodiments. Furthermore, a signal voltage can be more accurately and speedily converted into a corresponding frequency at the on-chip VCO's output as compared to getting the signal voltage out to a measuring device external to the IC.

This conversion preserves the characteristics of the signal by transforming the signal waveform into a frequency value form. The invention recognizes that exporting the signal itself from the chip according to the present methods of measuring the signal deteriorates the quality, accuracy, and timeliness of the signal waveform. The invention recognizes that exporting from the chip a value—the frequency value, instead of a voltage waveform, does not deteriorate the quality, accuracy, or timeliness of the waveforms, as the present methods do, because frequency can be measured according to an embodiment using on-chip counters and can be scanned out digitally instead of driving out the waveform.

Having achieved the conversion of a signal waveform to a frequency value, the mean and standard deviation of the signal can be computed using the frequencies as follows—

$$F_1 = a_2 V_g^2 + a_1 V_g + a_0$$

$$F_2 = b_2 V_g^2 + b_1 V_g + b_0$$

$E[F_1]$ being an expected value of frequency $F_1$, $E[F_2]$ being an expected value of frequency $F_2$, and $E[V_g]$ being an expected value of the signal voltage, $$E[F_1] = a_2 E[V_g^2] + a_1 E[V_g] + a_0$$

$$E[F_2] = b_2 E[V_g^2] + b_1 E[V_g] + b_0$$

$F_1$ and $F_2$ will vary as input control voltage is varying. Counting the frequency using counters measures the average frequency, in other words $E[F_1]$ and $E[F_2]$. The expected value of the signal voltage $E[V_g]$ can therefore be determined as—

$$E[V_g] = (b_2(E[F_1]-a_0) - a_2(E[F_2]-b_0))/(a_1 b_2 - a_2 b_1)$$

And the second moment of $V_g$ can be determined as, $$E[V_g^2] = (b_1(E[F_1]-a_0) - a_1(E[F_2]-b_0))/(a_2 b_1 - a_1 b_2)$$

µ being the mean value of the signal voltage, and σ being the standard deviation of the signal voltage, the mean and the standard deviation of the signal voltage can now be computed outside the chip by having exported only the frequency values and not the signal voltage waveforms according to the invention. The computation for the mean and standard deviation values are as follows—

$$\mu = E[V_g]$$

$$\sigma = \sqrt{(E[V_g^2] - (E[V_g])^2)}$$

The mean and the standard deviation are described as being computed outside the chip only as an example. In one embodiment, these computations can be performed by a circuit fabricated within the chip, by using an existing circuit in the IC by sending additional instructions to the circuit, or a combination thereof, within the scope of the invention.

Figure 7:
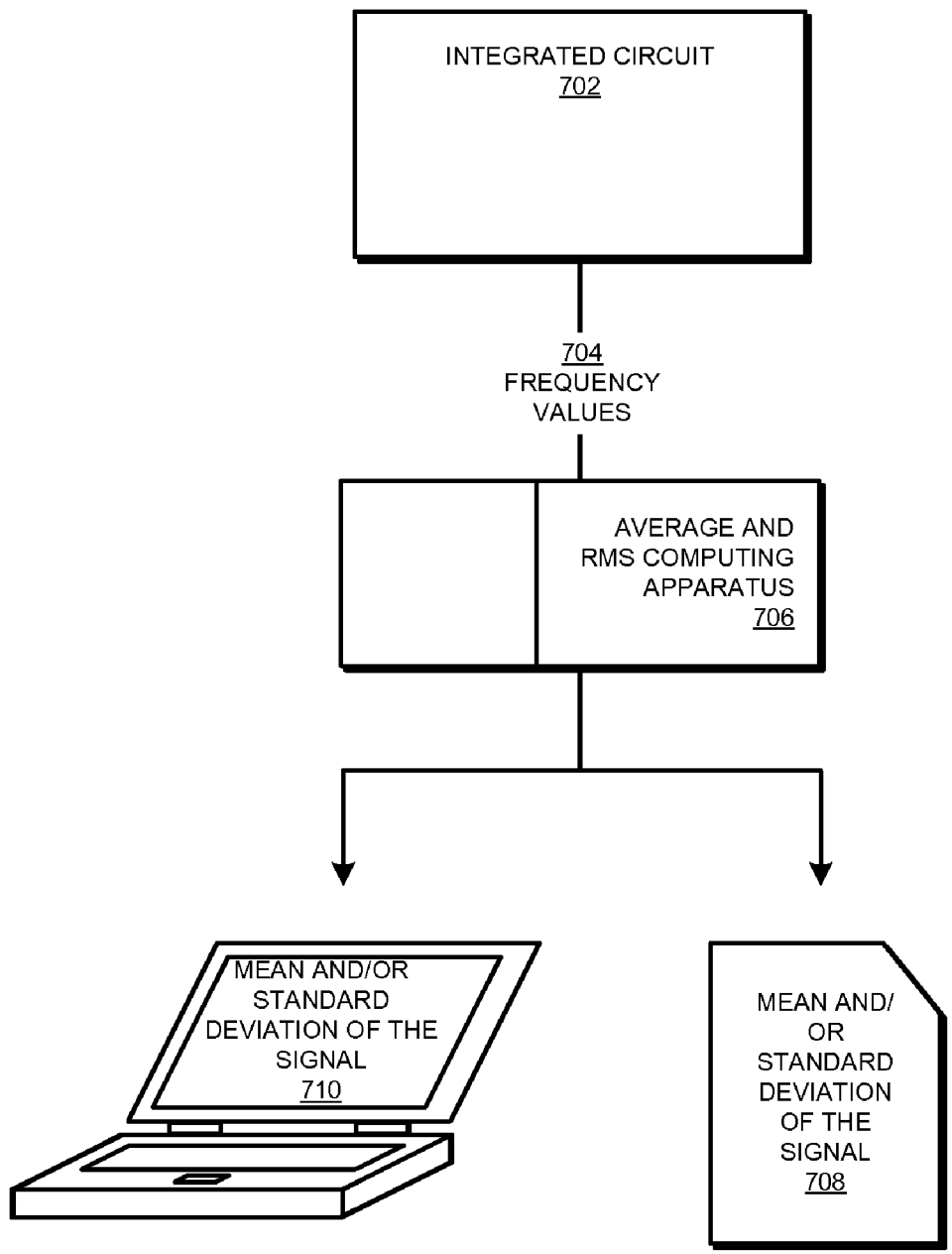
FIG. 7 depicts a block diagram of a configuration of systems for producing and presenting the mean value of a signal, the standard deviation of a signal, or a combination thereof in accordance with an illustrative embodiment.

With reference to FIG. 7, this figure depicts a block diagram of a configuration of systems for producing and presenting the mean value of a signal, the standard deviation of a signal, or a combination thereof in accordance with an illustrative embodiment. IC 702 may be analogous to IC 602 in FIG. 6. Frequencies 704 may be analogous to frequencies 612 in FIG. 6.

Apparatus 706 may be any apparatus capable of performing the computations of mean and/or standard deviation values of a signal using frequencies 704 according to the above equations. Apparatus 706 may output a mean value of the signal, a standard deviation value of the signal, or a combination thereof to report 708. Apparatus 706 may output the mean value of the signal, the standard deviation value of the signal, or a combination thereof to display 710, such as a display associated with a computer or apparatus 706.

Report 708 and display 710 are described only as example ways of publishing the information computed by apparatus 706. Apparatus 706 may publish this information in any other manner suitable for a particular implementation within the scope of the invention. For example, in one embodiment, apparatus 706 may store the information in a data storage device accessible over a data network.

Figure 8:
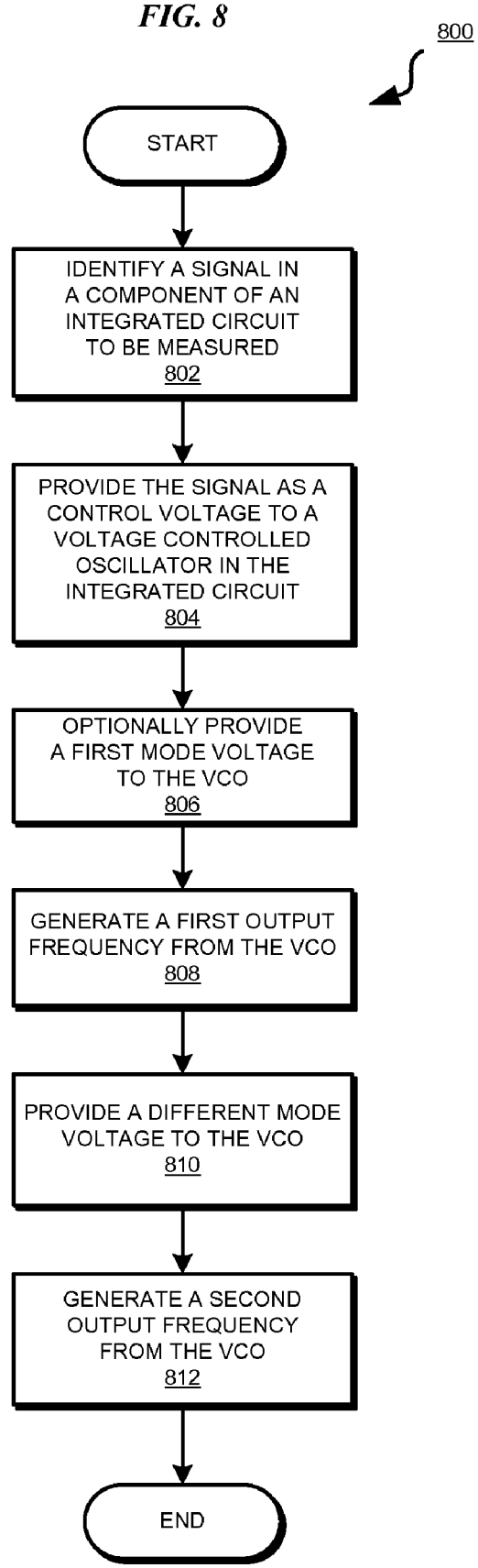
FIG. 8 depicts a flowchart of a process of converting a waveform of a signal to two corresponding frequencies in accordance with an illustrative embodiment.

With reference to FIG. 8, this figure depicts a flowchart of a process of converting a waveform of a signal to two corresponding frequencies in accordance with an illustrative embodiment. Process 800 may be implemented in an IC, such as IC 702 in FIG. 7.

Process 800 begins by identifying a signal to be measured in a component of an IC (step 802). Process 800 provides the signal as a control voltage to a VCO in the IC (step 804). In other words, the signal acts as a control voltage input to an on-chip VCO.

Process 800 may optionally provide a mode voltage to the VCO (step 806). Process 800 generates a first output frequency from the VCO (step 808).

Process 800 provides the signal as a control voltage to a VCO in the IC (step 804). In other words, the signal acts as a control voltage input to an on-chip VCO.

Process 800 may provide a mode voltage different from the mode voltage of step 806 to the VCO (step 810). Process 800 generates a second output frequency from the VCO (step 812). Process 800 ends thereafter.

Figure 9:
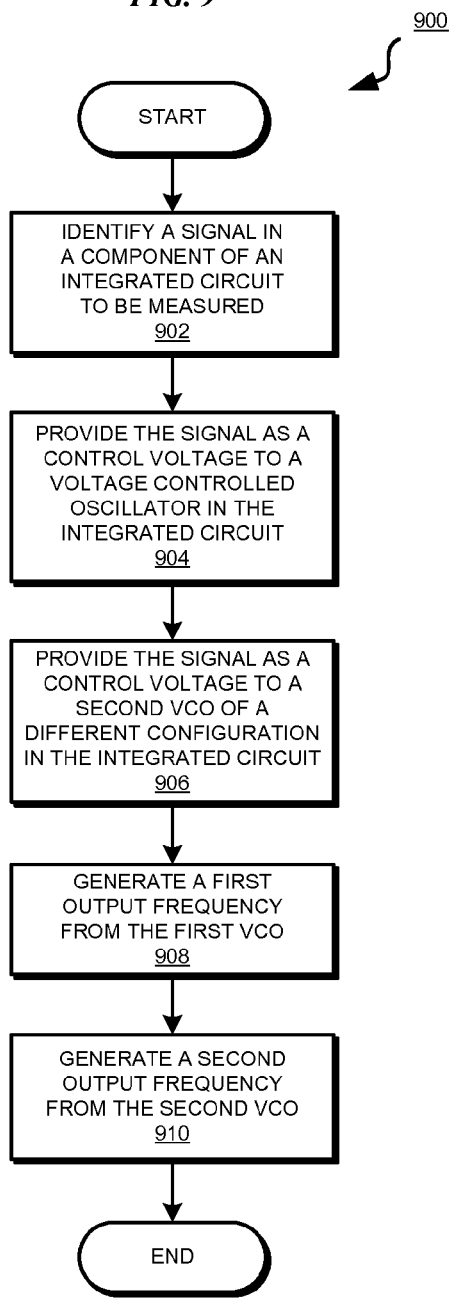
FIG. 9 depicts a flowchart of a second process of converting a waveform of a signal to two corresponding frequencies in accordance with an illustrative embodiment.

With reference to FIG. 9, this figure depicts a flowchart of a second process of converting a waveform of a signal to two corresponding frequencies in accordance with an illustrative embodiment. Process 900 may be implemented in an IC, such as IC 702 in FIG. 7.

Process 900 begins by identifying a signal to be measured in a component of an IC (step 902). Process 900 provides the signal as a control voltage to a VCO in the IC (step 904). Process 900 also provides the signal as a control voltage to a second VCO in the IC (step 906). The second VCO of step 906 is of a configuration different from the VCO of step 904 such that the two VCOs produce different frequencies for the same control voltage signal.

Process 900 generates a first output frequency from the first VCO of step 904 (step 908). Process 900 generates a second output frequency from the second VCO of step 906 (step 910). Process 900 ends thereafter.

Figure 10:
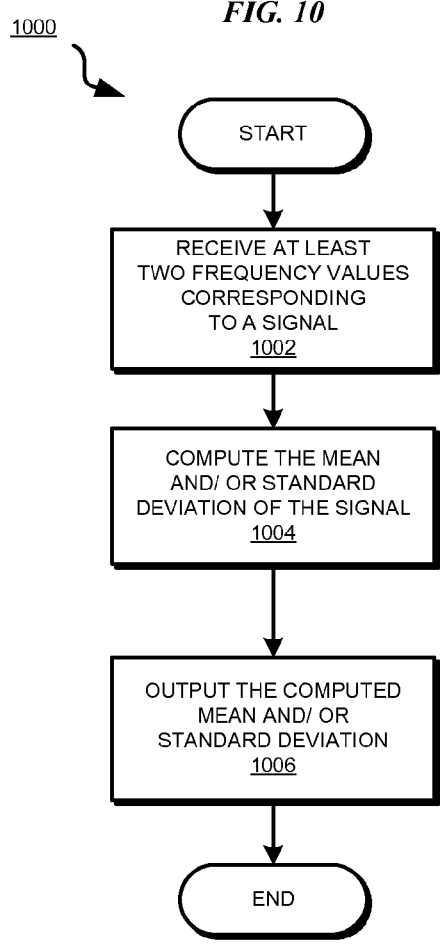
FIG. 10 depicts a flowchart of a process of computing the mean value, the standard deviation, or a combination thereof of a signal in accordance with an illustrative embodiment.

With reference to FIG. 10, this figure depicts a flowchart of a process of computing the mean value, the standard deviation, or a combination thereof of a signal in accordance with an illustrative embodiment. Process 1000 may be implemented in apparatus 706 in FIG. 7.

Process 1000 begins by receiving at least two frequency values that correspond to a signal at a node in a component in an IC (step 1002). For example, process 1000 may receive as two frequency values in step 1002 the two output frequencies from either process 800 in FIG. 8 or process 900 in FIG. 9.

Process 1000 computes a mean value, a standard deviation, or both of the signal using the at least two frequencies of step 1002 (step 1004). For example, process 1000 may execute step 1004 by performing the computations of $E[F_1]$, $E[F_2]$, $E[V_g]$, $\mu$, and $\sigma$ using the equations described above or other similar computations.

Process 1000 outputs or publishes the computed mean, standard deviation, or both of the signal (step 1006). Process 1000 ends thereafter. For example, process 1000 may perform the output of step 1006 by printing the information in a report at a printer, displaying the information on a display screen, writing the information in a data storage device over a data network, or providing the information to a web-server executing on a data processing system for a website. Process 1000 may output the information in any other manner suitable for a particular implementation within the scope of the invention.

The components in the block diagrams, the equations, and the steps in the flowcharts described above are described only as examples. The components, the equations, and the steps have been selected for the clarity of the description and are not limiting on the illustrative embodiments of the invention. For example, a particular implementation may combine, omit, further subdivide, modify, augment, reduce, or implement alternatively, any of the components or steps without departing from the scope of the illustrative embodiments. Furthermore, the steps of the processes described above may be performed in a different order within the scope of the invention.

Thus, a computer implemented method, apparatus, and computer program product are provided in the illustrative embodiments for on-chip measurement of signals in an IC. By using one or more illustrative embodiments of the invention, a signal can be more accurately analyzed as compared to the presently available methods. Furthermore, the analysis of the signal using an embodiment of the invention may be faster than the present methods.

A signal waveform at a node in an IC is converted to two or more frequency value using one or more on-chip VCOs. The frequency values, instead of the signal itself, are available for export from the chip. The frequency values are used to compute a mean and a standard deviation of the signal.

The computation of the mean and standard deviation is depicted as being performed outside the chip only as an example. The apparatus for these computations can also be fabricated on-chip within the scope of the invention.

The frequency values can be exported from the IC in any manner suitable for a particular implementation. For example, in one embodiment, a set of pins or a set of nodes in the IC may be set to make certain digital bit values available at those pins or nodes. A set of pins is one or more pins, and a set of nodes is one or more nodes. In one embodiment, the digital bits can be digitally scanned out from the chip using a scan interface provided for testing and other purposes in many ICs.

The invention can take the form of an entirely software embodiment, or an embodiment containing both hardware and software elements. In a preferred embodiment, the invention is implemented in software or program code, which includes but is not limited to firmware, resident software, and microcode.

Furthermore, the invention can take the form of a computer program product accessible from a computer-usable or computer-readable medium providing program code for use by or in connection with a computer or any instruction execution system. For the purposes of this description, a computer-usable or computer-readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

Further, a computer storage medium may contain or store a computer-readable program code such that when the computer-readable program code is executed on a computer, the execution of this computer-readable program code causes the computer to transmit another computer-readable program code over a communications link. This communications link may use a medium that is, for example without limitation, physical or wireless.

A data processing system suitable for storing and/or executing program code will include at least one processor coupled directly or indirectly to memory elements through a system bus. The memory elements can include local memory employed during actual execution of the program code, bulk storage media, and cache memories, which provide temporary storage of at least some program code in order to reduce the number of times code must be retrieved from bulk storage media during execution.

A data processing system may act as a server data processing system or a client data processing system. Server and client data processing systems may include data storage media that are computer usable, such as being computer readable. A data storage medium associated with a server data processing system may contain computer usable code. A client data processing system may download that computer usable code, such as for storing on a data storage medium associated with the client data processing system, or for using in the client data processing system. The server data processing system may similarly upload computer usable code from the client data processing system. The computer usable code resulting from a computer usable program product embodiment of the illustrative embodiments may be uploaded or downloaded using server and client data processing systems in this manner.

Input/output or I/O devices (including but not limited to keyboards, displays, pointing devices, etc.) can be coupled to the system either directly or through intervening I/O controllers.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to explain the principles of the invention, the practical application, and to enable others of ordinary skill in the art to understand the invention for various embodiments with various modifications as are suited to the particular use contemplated.

What is claimed is:

1. A method for on-chip measurement of a signal in an integrated circuit (IC), the method comprising:
   identifying a signal to be measured in the IC;

providing the signal as a first control voltage input to a first VCO in the IC;
generating a first output frequency from the first VCO, the first output frequency having a first frequency value corresponding to the signal;
providing the signal as a second control voltage input to a second VCO in the IC;
generating a second output frequency from the second VCO, the second output frequency having a second frequency value corresponding to the signal; and
exporting the first and the second output frequency values from the IC.

2. The method of claim 1, wherein the first control voltage input is provided to the first VCO at a first time and the second voltage input is provided to the second VCO at a second time, the first time and the second time being different times in a waveform of the signal.

3. The method of claim 1, further comprising:
providing one of (i) a first mode voltage to the first VCO, (ii) a second mode voltage to the second VCO, and (iii) a combination of the first mode voltage to the first VCO and the second mode voltage to the second VCO.

4. The method of claim 1, further comprising:
computing a mean value of the signal using the first and the second frequency values; and
publishing the mean value to a device associated with a data processing system.

5. The method of claim 4, wherein the computing is performed using a fabrication in the IC.

6. The method of claim 1, further comprising:
computing a standard deviation value of the signal using the first and the second frequency values; and
publishing the standard deviation value to a device associated with a data processing system.

7. The method of claim 6, wherein the computing is performed using a fabrication in the IC.

8. The method of claim 1, wherein exporting the first and the second frequency values from the IC comprises making the first and the second frequency values available at a scan interface in the IC.

9. A method for on-chip measurement of a signal in an integrated circuit (IC), the method comprising:
identifying a signal to be measured in the IC;
providing the signal as a first control voltage input to a VCO in the IC;
generating a first output frequency from the VCO, the first output frequency having a first frequency value corresponding to the signal;
providing the signal as a second control voltage input to a VCO;
providing a mode voltage with the second control voltage to the VCO;
generating a second output frequency from the VCO, the second output frequency having a second frequency value corresponding to the signal; and
exporting the first and the second output frequency values from the IC.

10. The method of claim 9, wherein the first control voltage input and the second voltage input are provided to the VCO at different times.

11. The method of claim 9, further comprising:
providing a first mode voltage to the VCO with the first control voltage, the first mode voltage being different from the mode voltage that is provided with the second control voltage.

12. The method of claim 9, further comprising:
computing a mean value of the signal using the first and the second frequency values; and
publishing the mean value to a device associated with a data processing system.

13. The method of claim 12, wherein the computing is performed using a fabrication in the IC.

14. The method of claim 9, further comprising:
computing a standard deviation value of the signal using the first and the second frequency values; and
publishing the standard deviation value to a device associated with a data processing system.

15. The method of claim 14, wherein the computing is performed using a fabrication in the IC.

16. The method of claim 9, wherein exporting the first and the second frequency values from the IC comprises making the first and the second frequency values available at a scan interface in the IC.

17. A computer usable program product comprising a non-transitory computer usable storage medium including computer usable code for on-chip measurement of a signal in an integrated circuit (IC), the computer usable code comprising:
computer usable code for identifying a signal to be measured in the IC;
computer usable code for providing the signal as a first control voltage input to a first VCO in the IC;
computer usable code for generating a first output frequency from the first VCO, the first output frequency having a first frequency value corresponding to the signal;
computer usable code for providing the signal as a second control voltage input to a second VCO in the IC;
computer usable code for generating a second output frequency from the second VCO, the second output frequency having a second frequency value corresponding to the signal; and
computer usable code for exporting the first and the second output frequency values from the IC via a scan interface on the IC.

18. The method of claim 17, further comprising:
computer usable code for computing a mean value of the signal using the first and the second frequency values, wherein the computing the mean value is performed using a first fabrication in the IC;
computer usable code for computing a standard deviation value of the signal using the first and the second frequency values, wherein the computing the standard deviation value is performed using a second fabrication in the IC; and
computer usable code for publishing at least one of (i) the mean value, and (ii) the standard deviation value to a device associated with a data processing system.

19. The computer program product of claim 17, wherein the computer usable code is stored in a computer readable storage medium in a data processing system, and wherein the computer usable code is transferred over a network from a remote data processing system.

20. The computer program product of claim 17, wherein the computer usable code is stored in a computer readable storage medium in a server data processing system, and wherein the computer usable code is downloaded over a network to a remote data processing system for use in a computer readable storage medium associated with the remote data processing system.

* * * * *